United States Patent [19]

Ulmer

[11] 4,143,362
[45] Mar. 6, 1979

[54] HIGH RESOLUTION AUTO-ZERO CIRCUIT FOR ANALOG-TO-DIGITAL CONVERTER

[75] Inventor: Richard W. Ulmer, Austin, Tex.

[73] Assignee: Motorola, Inc., Schaumburg, Ill.

[21] Appl. No.: 801,112

[22] Filed: May 27, 1977

[51] Int. Cl.$^2$ ............................................. H03K 13/20
[52] U.S. Cl. ...................... 340/347 NT; 340/347 CC; 340/347 M
[58] Field of Search .... 340/347 M, 347 CC, 347 AD, 340/347 NT; 324/99 D, 76 A

[56] References Cited

U.S. PATENT DOCUMENTS 3,942,173  3/1976  Wold ............................. 340/347 NT

*Primary Examiner*—Thomas J. Sloyan
*Attorney, Agent, or Firm*—Joe E. Barbee

[57] ABSTRACT

An analog-to-digital converter includes an integrator which includes an amplifier having an offset voltage. A counter is responsive to a counter clock signal for counting during the duration of a first integration and transferring its count at the end of the first integration to a storage circuit. The counter is then reset. It then counts during the duration of a second integration. Coincidence circuitry is provided which causes the counter to be reset during the second integration when its count matches the count stored in the storage circuit. The counter then continues counting until the end of the second integration. The uncertainty associated with the count stored in the counter at the end of the second integration is improved by provision of a circuit responsive to the comparison signal and first and second clock signals for producing the counter clock signal. The counter clock signal is produced such that it is in phase with the first clock signal if the comparison signal at the end of the first integration occurred before the beginning of a subsequent pulse of the second clock signal. Otherwise, the third clock signal is delayed so that it is temporarily in phase with the second clock signal.

7 Claims, 9 Drawing Figures

HIGH RESOLUTION AUTO-ZERO CIRCUIT FOR ANALOG-TO-DIGITAL CONVERTER

BACKGROUND OF THE INVENTION

1. Field of the Invention

The invention relates to improved analog-to-digital conversion circuits, and especially to circuitry for improving the resolution or accuracy of analog-to-digital converter circuits.

2. Brief Description of the Prior Art

Frequently, prior art A/D converters require connection of numerous external capacitors, resistors, and diodes. Frequently, such external components must be carefully matched and of high precision, and are frequently highly temperature sensitive, and frequently have characteristics which change with age, thereby necessitating frequent manual recalibration of the A/D converter.

An improved prior art analog-to-digital converter which overcomes many of these difficulties is described in copending application Ser. No. 666,528, filed Mar. 12, 1976, by Robert C. Huntington and assigned to the present assignee and incorporated herein by reference. In the co-pending Huntington application, amplifier offset voltages are compensated for automatically and a zero reference is established automatically twice every conversion cycle to provide a corrected output. A compensation capacitor and an integrating capacitor are selectively charged. A reference signal is then integrated to measure the magnitude of the difference between an integrator offset voltage and a comparator threshold voltage. A counter counts during the integration to produce a digital representation of the difference between the integrator offset voltage and the comparator threshold, which digital representation is then stored. The compensation capacitor and the integrating capacitor are again selectively charged. The integrating capacitor is charged to a voltage representative of the analog input signal. During integration of the reference signal from the voltage representative of the analog input signal to the comparator threshold voltage, the counter continually counts, but is automatically reset to zero and continues counting when the count reaches the value of the stored number which represents the difference between the integrator offset voltage and the comparator threshold voltage. However, the accuracy or resolution of the least significant digit of the contents of the counter at the end of the second integration has an uncertainty associated therewith, which uncertainty is the sum of the uncertainty caused by the fact that the portions of the basic operating cycle of the analog-to-digital converter at which both the first and the second integrations occur are undetermined.

SUMMARY OF THE INVENTION

It is an object of the invention to provide an analog-to-digital conversion circuit having both high resolution and requiring a minimum number of external components.

It is another object of the invention to provide a high resolution analog-to-digital converter which is relatively independent of variations in component characteristics due to variations in temperature and due to aging.

It is another object of the invention to provide circuitry in an analog-to-digital converter circuit which increases the resolution of the digital output by detecting which portion of a basic operating cycle at which an internal comparator switched and by storing information indicative of the detection and by utilizing the stored information to shift the phase of a internally produced signal which clocks a counter which measures duration of integrations in the analog-to-digital converter circuit.

Briefly described, the invention is an analog-to-digital conversion circuit for producing a digital representation of an analog signal. The A/D conversion circuit includes a clock circuit for producing a first clock signal and a second clock signal delayed from the first clock signal. A comparator circuit is provided which has a threshold voltage and which produces a comparison signal. An integrator circuit includes an amplifier having an offset voltage. The integrator integrates a reference voltage from the offset voltage to the threshold voltage of the comparator during one cycle of operation and also integrates the same reference voltage from a voltage representative of an analog input to the analog-to-digital converter to the threshold voltage of the comparator during another cycle of operation. A counter circuit responsive to a counter clocking circuit counts during both of the above integration operations. The counter circuit is responsive to a comparison signal which is produced at the end of each of the two integration operations. The count in the counter at the end of the first integration operation is stored in a storage circuit. A coincidence circuit is provided which causes the counter to be reset at the point during the second integration at which the counter contents are equal to the stored count in the storage circuit. The counter continues counting until the end of the second integration operation. The counter clocking signal is produced by a circuit responsive to the comparison signal and to the first and second clock signals. The counter clocking signal is produced so that it is substantially in phase with the first clock signal if the comparison signal occurs between the beginning of a pulse of the first clock signal and the beginning of a subsequent pulse of the second clock signal, but is delayed so that it is temporarily substantially in phase with the second clock signal if the comparison signal occurs after the beginning of the subsequent pulse of the second clock signal.

BRIEF DESCRIPTION OF THE DRAWINGS

FIG. 8 is a diagram of circuitry for determining which phase the comparator switch is at.

DETAILED DESCRIPTION OF THE INVENTION

In order to better illustrate the advantages of the invention and its contribution to the art, a preferred embodiment of the invention will now be described in detail.

Figure 1:
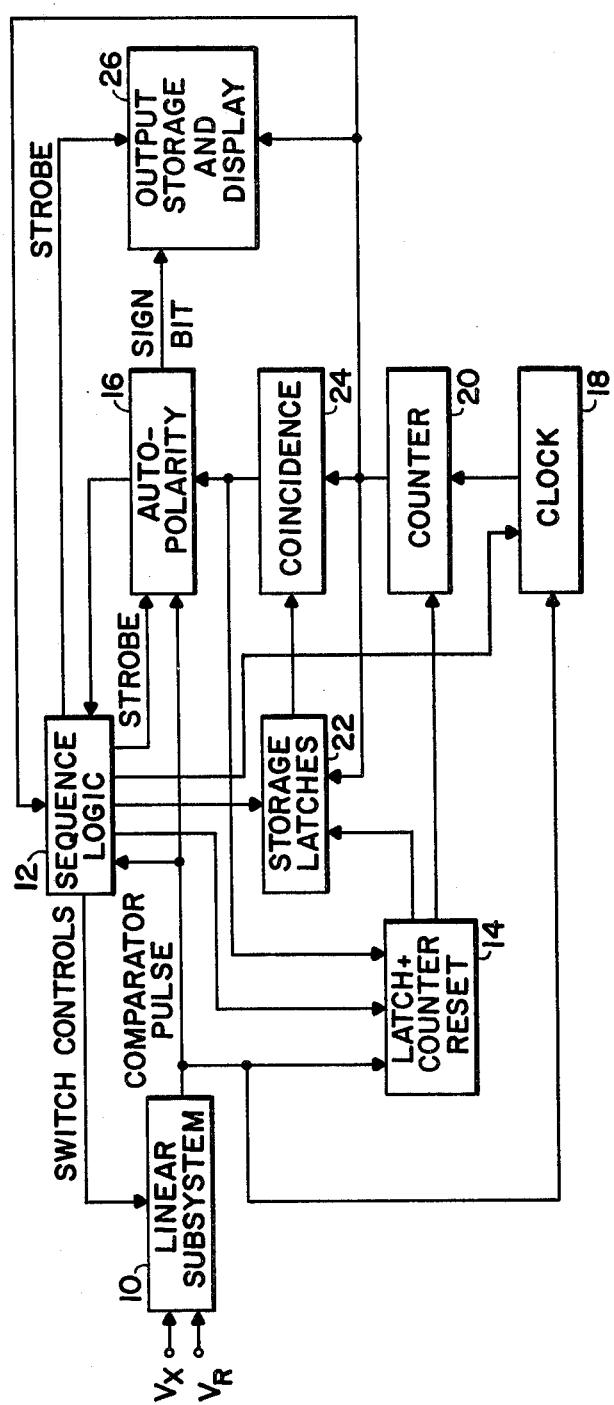
FIG. 1 is a block diagram of an analog-to-digital converter system embodying the present invention.

The A/D converter system in accordance with the invention, as illustrated in FIG. 1, includes a linear subsystem 10 which receives and processes the unknown incoming signal $V_X$ and the reference voltage $V_R$. Linear subsystem 10 receives switch control signals from the sequence logic unit 12. Periodically, the linear subsystem 10 generates a comparator pulse output signal which is coupled to the sequence logic unit 12, a latch and counter reset unit 14 and to an autopolarity unit 16. A clock circuit 18 generates a timing signal which is coupled to a counter 20. The output of counter 20 is coupled to a set of storage latches 22, a coincidence unit 24, an output storage and display unit 26, and a sequence logic unit 12. The output of latch and counter reset unit 14 is coupled to the counter 20 and the storage latches 22. Latch and counter reset unit 14 receives input signals from linear subsystem 10, coincidence unit 24 and the sequence logic unit 12. Autopolarity unit 16 receives an additional input signal from sequence logic unit 12 and generates a first output signal which is coupled to sequence logic unit 12 and a second sign bit output signal which is coupled to the output storage and display unit 26. The output storage and display unit 26 also receives a strobe input signal from sequence logic unit 12.

Figure 2:
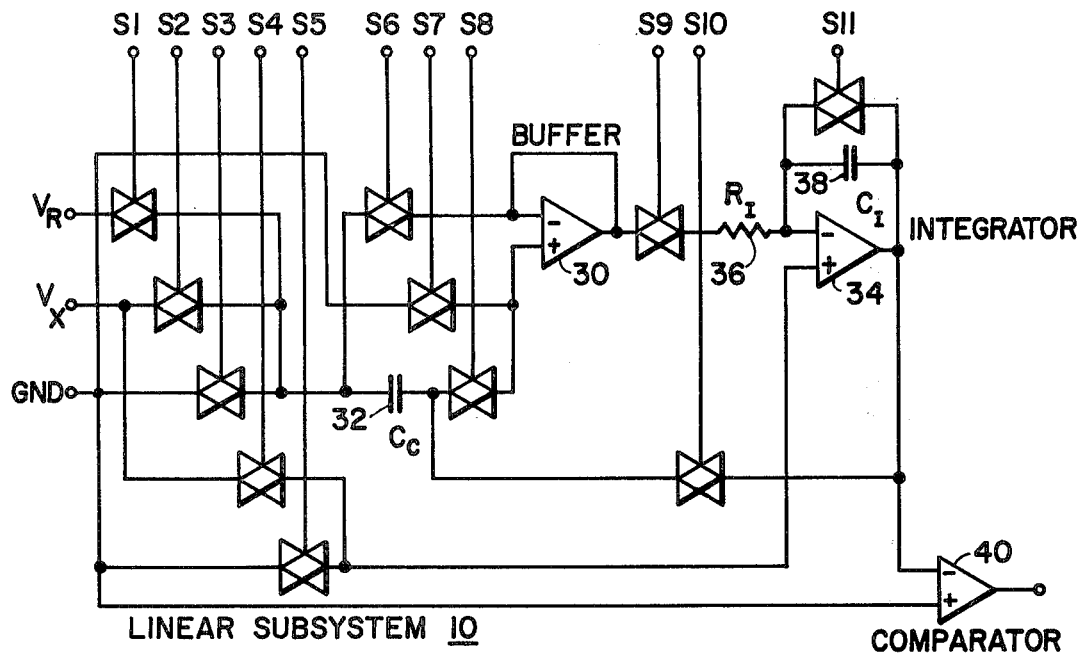
FIG. 2 is a diagram illustrating more detailed logic circuitry for part of the system of FIG. 1.

A more detailed breakdown of the linear subsystem 10 or input means is shown in FIG. 2. Linear subsystem 10 includes a plurality of transmission gates or logic means S1, S2, S3 ... S11. Linear subsystem 10 further consists of a plurality of analog means including buffer amplifier 30, compensating capacitor $C_c$ indicated by reference numeral 32, integratator resistor $R_I$ indicated by reference numeral 36, integrator capacitor $C_I$ indicated by reference numeral 38, integrator amplifier 34 and comparator 40.

Buffer amplifier 30 has an input offset voltage $E_{Bos}$. Integrator op amp 34 has an input offset voltage $E_{ios}$. Comparator 40 has an input offset voltage $E_{cos}$. All non-inverting amplifier inputs are shown by a "+" while all inverting amplifier inputs are shown by a "−".

A characteristic common to all operational amplifiers (op amps) is that they have input offset voltages which vary with temperature and which differ from unit to unit. Usually, means are provided for manually zeroing this offset by adjusting a pot. In the A/D converter of the present invention, offset voltages in the buffer and integrator op amps 30 and 34 have the effect of being added directly to the input signal and therefor producing large system errors unless they are nulled. In this system both buffer and integrator op amp offsets are compensated automatically during each conversion cycle in a manner which will be described.

Figure 3:
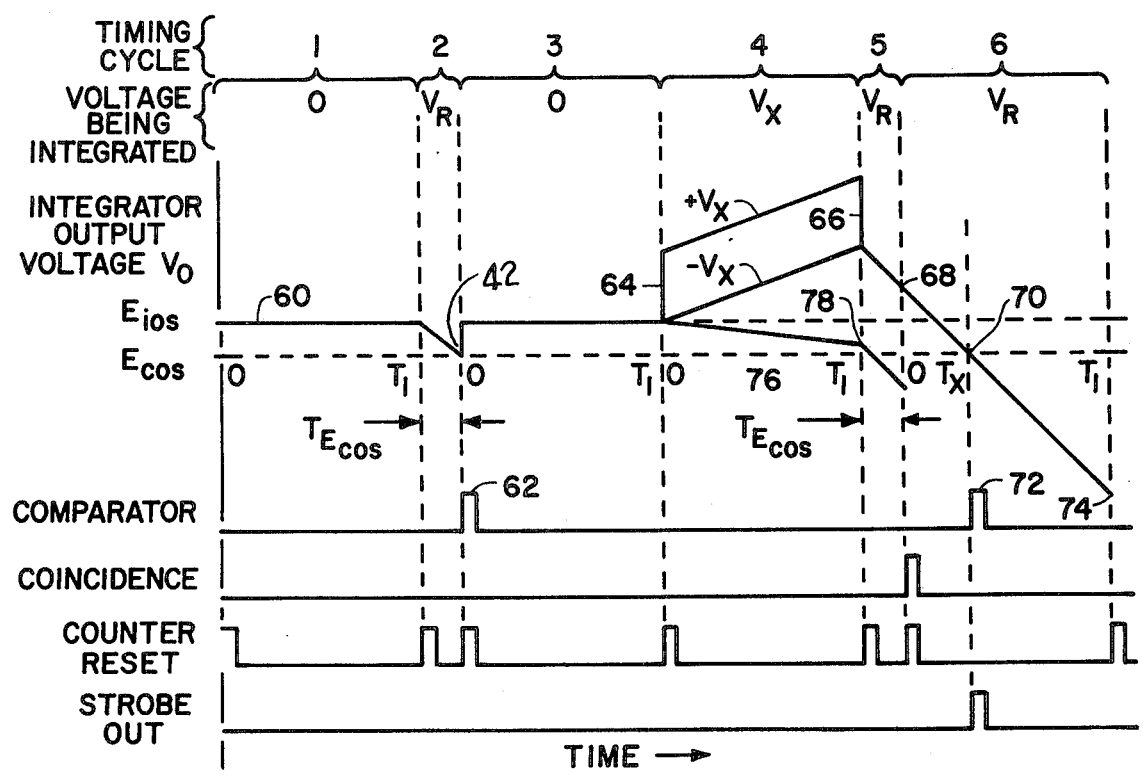
FIG. 3 is a timing diagram useful in explaining the invention.

FIG. 3 is an operation sequence diagram which shows the integrator output voltage waveform 60 plotted as a function of time during each of the six timing cycles which constitutes one complete A/D conversion cycle. At the bottom of FIG. 3, the timing relationships of the comparator, coincidence, counter reset, and strobe output pulses are shown.

For each of the six timing cycles the linear subsystem 10 assumes a configuration determined by the switch closures listed in FIG. 3 of above-mentioned copending application Ser. No. 666,528.

During cycle 1, which is the compensating circuit configuration, amplifiers 30 and 34 are connected as grounded voltage followers. Also, during cycle 1 the compensating capacitor 32 is connected between the outputs of amplifiers 30 and 34 such that it is charged to a voltage equal to the difference between the two offsets, or $$V_{AB} = E_{ios} - E_{Bos}$$

where $E_{ios}$ and $E_{Bos}$ are the offset voltages of the integrator amplifier 34 and the buffer amplifier 30. Connecting the integrator as a voltage follower discharges the integrating capacitor 38, which automatically resets the integrator to zero. FIG. 2 shows that integrating capacitor 38 is discharged during cycle 1 by closing switch S11. In the preferred embodiment, when counter 20 reaches a full count of 2,000 at a time shown as $T_1$ in FIG. 3, cycle 1 is terminated, the counter 20 is reset to zero by a counter reset pulse from latch and counter reset unit 14, and cycle 2 is initiated. The integrator output voltage $V_O$ during cycle 1 equals $E_{ios}$ as is shown by waveform 60 of FIG. 3.

The function of cycle 2 is to allow the offset compensated buffered integrator circuit to integrate the reference voltage $V_R$ which is present on one terminal of compensating capacitor 32 while the counter 20 is simultaneously counting from an initial zero state. This integration continues until the integrator output voltage $V_O$ at 42 equals the comparator threshold voltage $E_{cos}$. When $V_O = E_{cos}$ the comparator 40 inverts its output state and produces the comparator pulse shown in FIG. 3 at reference number 62. At this time, the digital content of the counter 20 is caused to be strobed into the storage latches 22 by a signal from the sequence logic unit 12, the counter 20 is reset to zero, cycle 2 is terminated and cycle 3 is initiated. More specifically, the purpose of cycle 2 is to exactly determine the magnitude of the voltage quantity ($E_{ios} - E_{cos}$) by measuring the time required to integrate from $E_{ios}$ to $E_{cos}$ while reference voltage $V_R$ is applied. This exact representation of the difference between the integrator offset voltage $E_{ios}$ and the comparator threshold voltage $E_{cos}$ is stored digitally in the storage latches 22 at the end of cycle 2 so that it can be used at a later time to compensate for errors due to offset voltages.

The circuit configuration during cycle 3 is an exact repetition of cycle 1. Cycle 3 is terminated by the completion of a full count by counter 20 at which point counter 20 is reset and cycle 4 is initiated. The unknown input voltage $V_X$ to the A/D converter can be either positive or negative. The system will not only measure the magnitude of the input voltage $V_X$ but will also determine and indicate its polarity.

If the unknown input voltage is negative and is represented by $-V_X$, and in the immediately preceeding A/D conversion the input signal has a negative polarity, the integrator output voltage $V_O$ during cycle 4 for a $-V_X$ input polarity is shown by the portion of waveform 60 lying beneath the $-V_X$ designation shown for cycle 4 of FIG. 3. This integration continues until counter 20 reaches a full count after a time $T_1$. At this point the counter 20 is reset and cycle 5 is initiated.

In the alternative, if the unknown input signal during the immediately preceding A/D conversion had been a positive voltage represented by $+V_X$, waveform 60 shifts up along path 64 to a level $V_X$ above the level of $E_{ios}$. The slope of the integrator output is exactly the same as it was for the cycle 4− configuration if the magnitudes of $-V_X$ and $+V_X$ are equal. At the completion of timing cycle 4, the integrator output voltage $V_O$ is shifted down along path 66 so that the voltage $V_O$ is now at the same point that it would have been had a negative polarity input signal of equal magnitude been present.

Cycle 5 is the same for either input signal polarity. The purpose of cycle 5 is to integrate the offset compensated reference voltage $V_R$ until the content of the counter 20 equals the count contained in the storage latches 22 from cycle 2. This is in effect subtracting the difference between the integrator offset voltage and the comparator threshold voltage from the voltage which was on the integrating capacitor 38 at the end of cycle 4 so that the absolute voltage of the unknown input signal can be measured during cycle 6. The slope of the integrator output waveform during cycle 5 is identical to the slope of the waveform during cycle 2 since during both cycle 2 and cycle 5 the reference voltage $V_R$ is the integrator capacitor 38. A time $T_{E_{cos}}$ was required during cycle 2 to reduce the integrator output voltage $V_O$ from $E_{ios}$ to $E_{cos}$. Therefore, during cycle 5 an identical time $T_{E_{cos}}$ is also required. During cycle 5 when the counter 20 reaches this state the coincidence unit 24 senses that the count contained in the storage latches 22 coincides with that contained in counter 20. At this point, a coincidence pulse is generated by coincidence unit 24 as is shown in the lower part of FIG. 3. This coincidence pulse causes the counter 20 to be reset to zero which terminates cycle 5 but allows the integration to continue without interruption into cycle 6. During cycles 5 and 6 the voltage to which the integrating capacitor 38 had been charged during cycle 4 is removed by the negative-going integration of the reference voltage $V_R$.

Integration during cycle 6 continues until the threshold voltage $E_{cos}$ of comparator 40 is reached at location 70 on waveform 60. At this point the comparator 40 changes state, producing the comparator pulse shown at reference number 72 in the lower part of FIG. 3. At this time, the contents of counter 20 which had been reset at the start of cycle 6 at point 68 along waveform 60 is strobed into the output storage display unit 26. This latter output is equivalent to the digital output of a single A/D conversion. It is a simple matter of logic circuit design to present this output in whatever format (such as parallel or multiplex) is desired. Cycle 6 can be terminated either by the triggering of the comparator 40 which would occur at location 70 along waveform 60 or by completion of a full count after a time $T_1$ into cycle 6 which would occur at location 74 on waveform 60. The latter method was used in the preferred embodiment of the invention.

Figure 4:
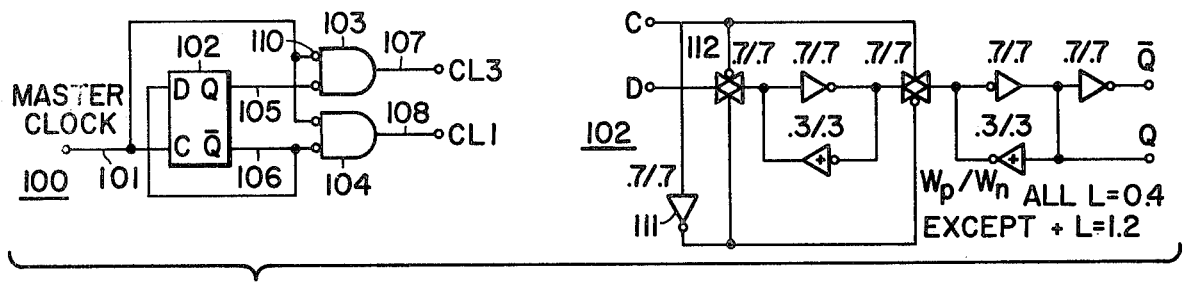
FIG. 4 is a logic diagram of a two-phase clock generator according to the invention.

FIG. 4 illustrates a two-phase clock generator which is included in clock circuit 18 of FIG. 1. Clock generator circuit 100 includes D-type flip-flop 102 and NAND gates 103 and 104. The master clock input to clock generator 100 may be obtained from an oscillator which may be in clock circuit 18 of FIG. 1, and the frequency of the oscillator may be determined by an external resistor or crystal (not shown). The master clock signal on 101 is applied to the clock (C) input of D-type flip-flop 102 and also to one input of each of NAND gates 103 and 104. The delay or D input of flip-flop 102 is coupled to the false, or $\bar{Q}$ output 106 of D-type flip-flop 102, which is also connected to the other input of NAND gate 104. The "true" or Q output of flip-flop 102 is connected to the other input of NAND gate 103. The outputs of NAND gates 103 and 104 are designated 107 and 108, respectively, and produce clock signals CL3 and CL1, respectively. D-type flip-flop 102 may be implemented as indicated in the logic circuit shown in FIG. 4 immediately to the right of below clock generator 100. The conventional inverter symbol such as 111 are utilized to designate complementary MOS (CMOS) inverters which are well known in the art. The ratios adjacent each of the inverters indicate the $W_p/W_n$ (P-channel MOSFET channel width/N-channel MOSFET channel width). The symbols such as 112 designate CMOS transmission gates which are also well known in the art; the ratios adjacent each CMOS transmission gate also designate the $W_p/W_n$ ratio.

Figure 5:
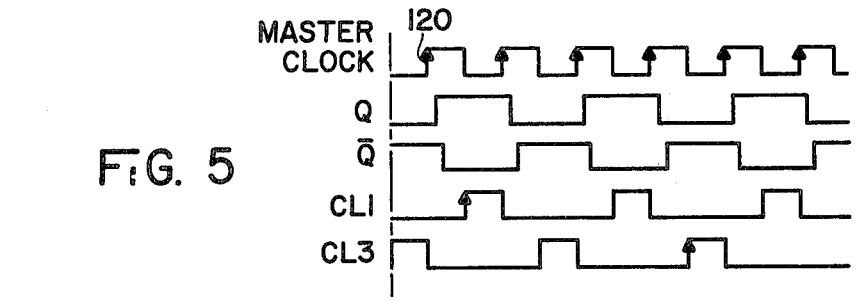
FIG. 5 is a timing diagram useful in explaining the operation of the circuit of FIG. 4.

The operation of clock generator 100 can be readily ascertained by reference to the timing diagram of FIG. 5. The arrows such as 120 on the master clock signal in FIG. 5 indicate that D-type flip-flop 102 is triggered by the rising edge of the master clock signal. It can be seen that NAND gates 103 and 104 decode the flip-flop outputs Q and $\bar{Q}$ and the master clock input 101 to produce signals CL1 and CL3 which have the same pulse width as the complement of the master clock signal, a duty cycle of approximately twenty-five percent, and are non-overlapping and out of phase with each other.

Figure 6:
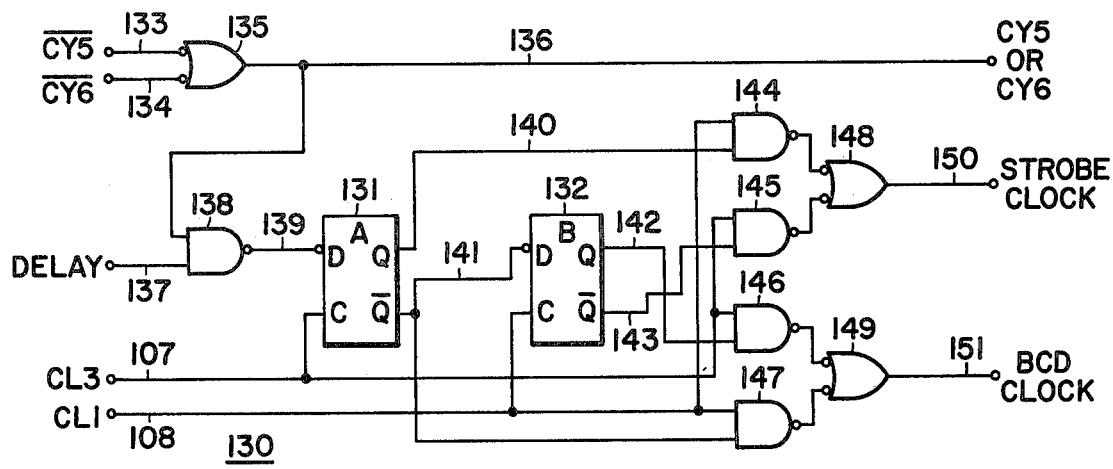
FIG. 6 is a logic diagram of clock selection logic circuitry according to the invention.
Figure 6:
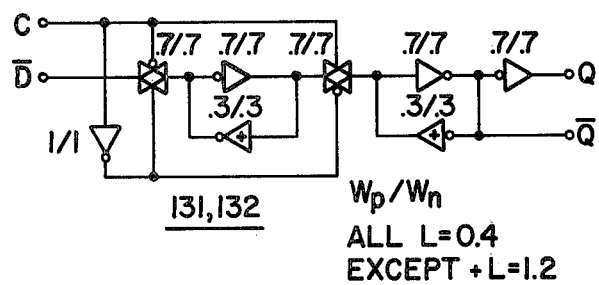

Referring to FIG. 6, it is seen that clock selection circuit 130 receives clock signals CL1 and CL3 generated by clock generator 100. Clock selection circuit 130 also receives an input called DELAY on conductor 137 and two sequence signals $\overline{CY5}$ (cycle 5) and $\overline{CY6}$ (cycle 6) generated by sequential logic 12 of FIG. 1 on conductors 133 and 134, respectively. The DELAY signal on 137 is generated by the clock delay determination circuit 156 in FIG. 8. Clock selection logic of FIG. 6 generates three output signals, which include a signal called BCD CLOCK on conductor 151, STROBE CLOCK on conductor 150, and a signal called "CY5 or CY6" on conductor 136.

Figure 7:
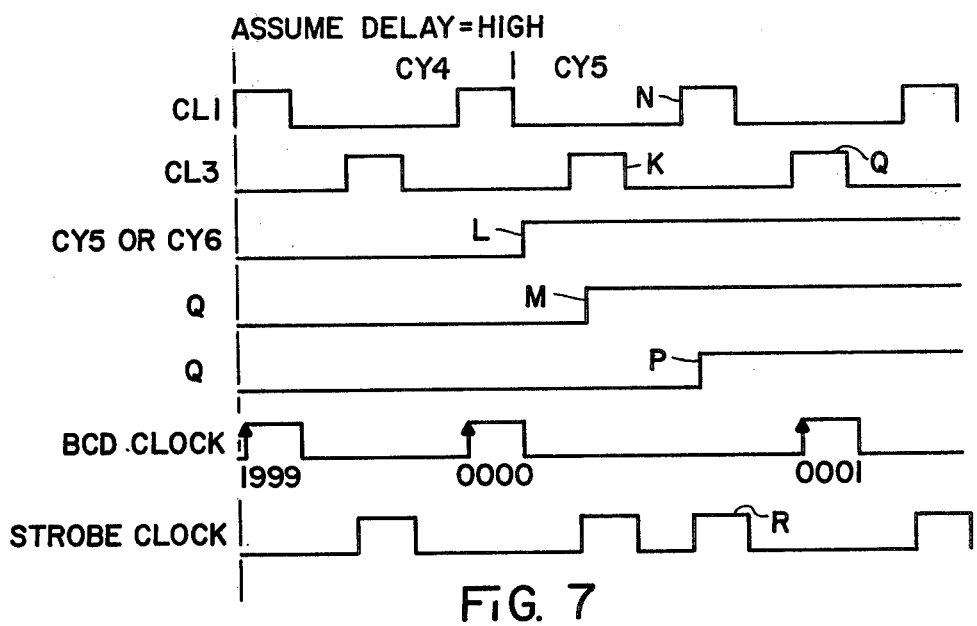
FIG. 7 is a timing diagram useful in explaining the operation of the circuitry of FIG. 6.

In essence, what clock selection circuit 130 does is to produce the BCD CLOCK signal which is utilized to effect clocking of counter 20 in FIG. 1. If the signal on delay conductor 137 is at a logical zero, BCD CLOCK will be in phase with CL1, as can be seen from the BCD CLOCK and CL1 clock diagrams in FIG. 7. Note the first two pulses designated 1999 and 0000 in FIG. 7. However, if the DELAY signal on 137 is at a logical "one", clock selection circuit 130 causes BCD CLOCK to be delayed so that it is in phase with CL3 instead of CL1, as indicated by pulse 0001 in FIG. 7. The STROBE CLOCK pulse is effected in the opposite manner. Normally, it is in phase with CL3 if DELAY is at a "zero", but if DELAY is at a "one", STROBE CLOCK becomes in phase with CL1, as indicated in FIG. 7.

Before discussing clock selection circuit 130 in more detail, clock delay determination 155 in FIG. 8 will be described.

Figure 8:
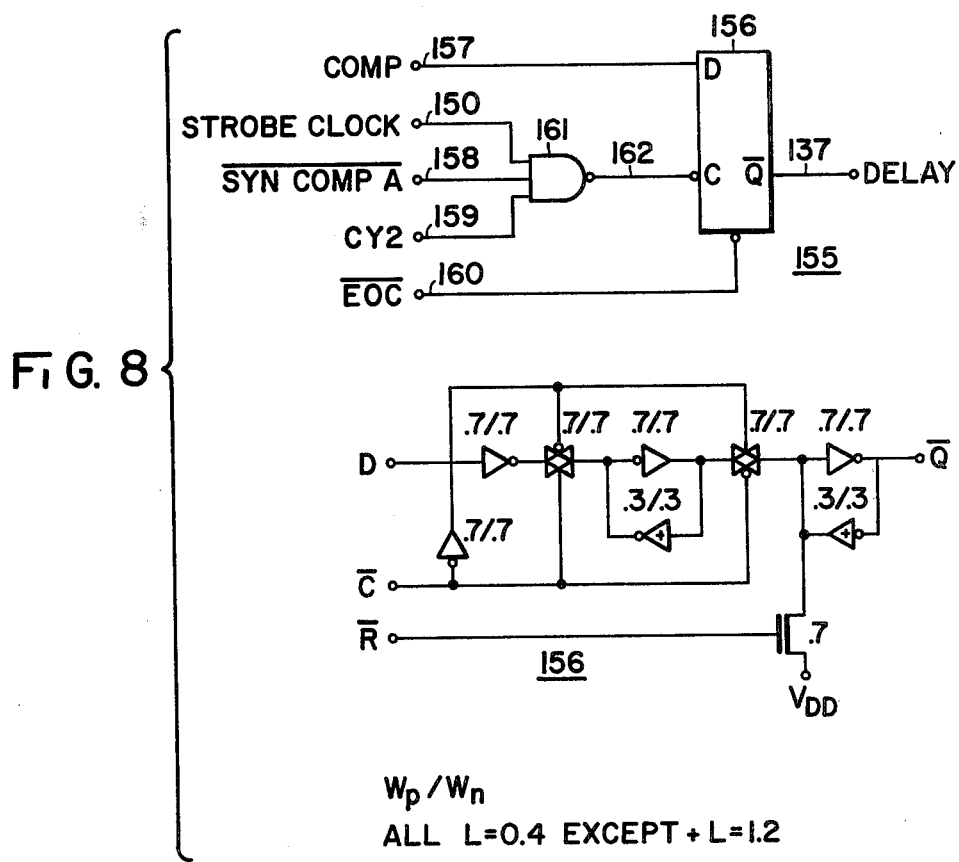
Figure 9:
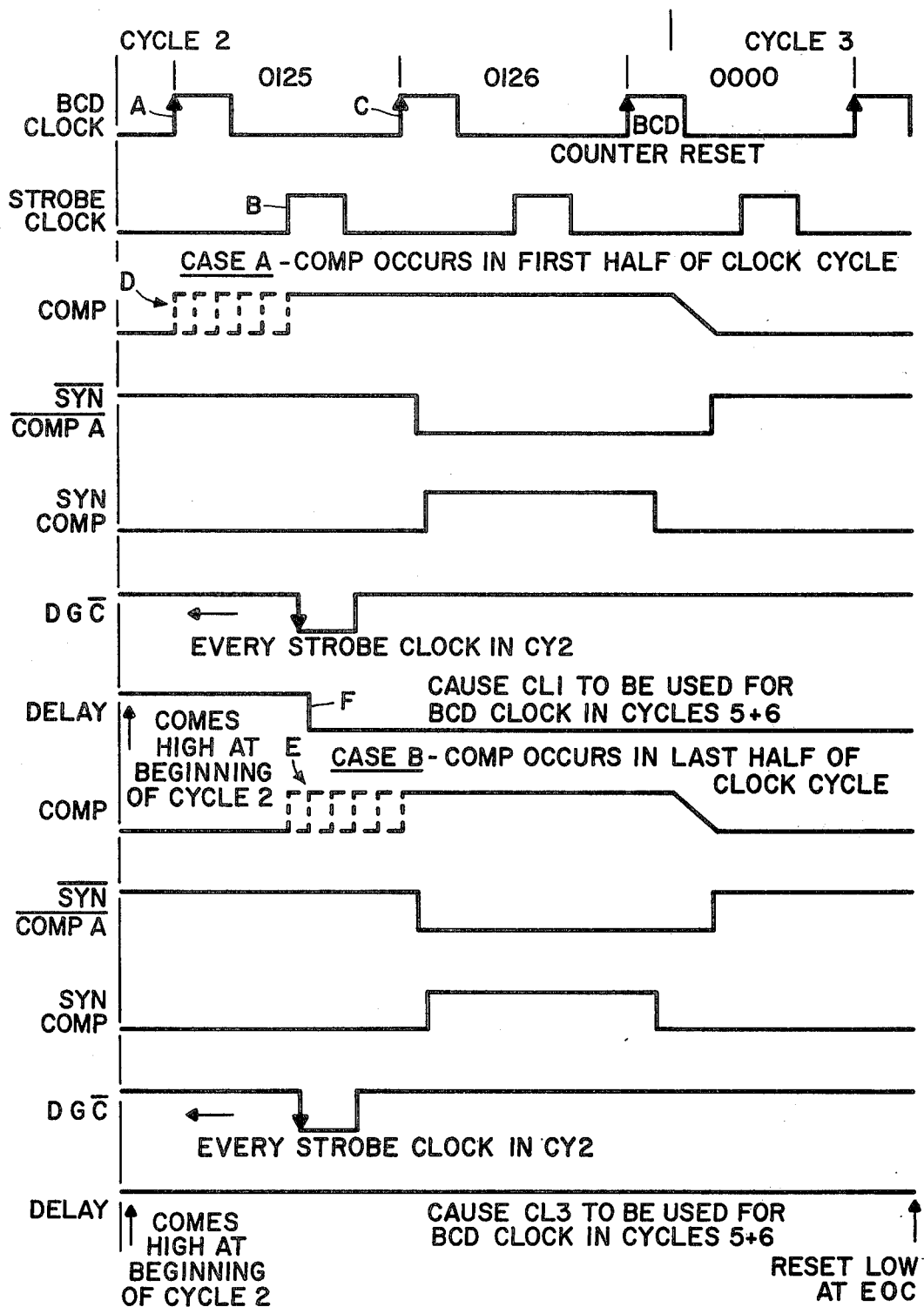
FIG. 9 is a diagram useful in describing the operation of FIGS. 6 and 8.

Referring to FIG. 8, clock delay determination circuit 155 includes a D-type flip-flop 156, a preferred implementation of which is indicated by the logic diagram immediately below clock delay determination circuit 155. The D (delay) input to D-type flip-flop 156 is connected to conductor 157, which has a signal called COMP applied thereto. The COMP signal applied to conductor 157 is the comparator pulse indicated in FIG. 1 and is generated by linear subsystem 10. It is also the output of comparator 40 in FIG. 2. The $\bar{Q}$ output of D-type flip-flop 156 is carried by conductor 137, as the DELAY mentioned above as an input to the clock selection circuit of FIG. 6. The clock input (C) of D-type flip-flop 156 is connected to conductor 162, which is the output of NAND gate 161, which in turn has the STROBE CLOCK signal on conductor 150 applied to one of its inputs, a signal called $\overline{\text{SYN COMP A}}$ generated by sequence logic 12 of FIG. 1 applied to another input, and a timing signal called CY2 (cycle 2) generated by sequence logic 12 applied on conductor 159 to another input. A signal called $\overline{\text{EOC}}$ applied to conductor 160 is applied to a reset input R of D-type flip-flop 156. The operation of clock delay determination circuit 155 may be appreciated by referring to FIG. 9, which illustrates the operation for two cases referred to as "case A" and "case B". "Case A" refers to the situation in which the signal COMP occurs during the first half of the "clock cycle." The term "clock cycle" refers to the cycle of BCD CLOCK when it is synchronized with CL1, as previously discussed. In FIG. 9, the first half of the "clock cycle" is the period of time between edge A of BCD CLOCK and edge B of STROBE CLOCK. The second half of the "clock cycle" is the period between edge B of STROBE CLOCK and edge C of BCD CLOCK.

The dotted lines D of the COMP waveform under case A indicate that the comparator output pulse occurs during the first half of the clock cycle, as defined above. The inputs $\overline{\text{SYN COMP A}}$ STROBE CLOCK, CY2, and $\overline{\text{EOC}}$ are the same for both case A and case B. The only difference is that COMP occurs either during the first half of the "clock cycle" for case A as indicated by D or during the second half of the "clock cycle" for case B, as indicated by E in FIG. 9. In case A, the DELAY output, which is initially high at the beginning of cycle 2 for both case A and case B, goes low at edge F for case A, but remains at a logical "1" as indicated in case B.

Referring back to FIG. 6, it is seen that clock selection circuit 130 includes two D type flip-flops 131 and 132, which are in practice implemented as indicated in the circuit located immediately below clock selection circuit 130 in FIG. 6. The D (delay) input of D-type flip-flop 131 (which is actually a $\bar{D}$ input, as indicated by the small circle at the D input at 139) is connected to the output of NAND gate 138. NAND gate 138 has one input connected to conductor 137, which has the DELAY signal applied thereto, and has its other input connected to conductor 136, which is connected to the output of NOR gate 135, which has its inputs connected to conductors 133 and 134. The Q (true) output of D-type flip-flop 131 is connected to conductor 140, which is connected to one input of NAND gate 144, the other input of which is connected to CL1 conductor 108. The $\bar{Q}$ (false) output of D-type flip-flop 131 is connected to conductor 141, which is connected to the D input of D-type flip-flop 132 and is also connected to one input of NAND gate 147. The other input of NAND gate 147 is connected to conductor 108. The clock (C) input of D-type flip-flop 131 is connected to CL3 conductor 107, while the C (clock) input of D-type flip-flop 132 is connected to CL1 conductor 108. The Q output of D-type flip-flop 132 is connected to conductor 142, which is connected to one input of NAND gate 146, the other input of which is connected to CL3 conductor 107. The $\bar{Q}$ output of D-type flip-flop 132 is connected to one input of NAND gate 145 by conductor 143, the other input of which is connected to CL3 conductor 107. NOR gate 148 has its output connected to strobe clock conductor 150, one input connected to the output of NAND gate 144 and its other input connected to the output of NAND gate 145. NOR gate 149 has its output connected to BCD CLOCK conductor 151, one input connected to the output of NAND gate 146, and its other input connected to the output of NAND gate 147.

As mentioned above, if DELAY is at a "zero" BCD CLOCK is in phase with CL1, and STROBE CLOCK is in phase with CL2, and if DELAY is raised to a "one" and held there through cycle 2, then CL3 will be gated to form BCD CLOCK and CL1 will be gated so as to produce STROBE CLOCK. The purpose of D-type flip-flops 131 and 132 is to prevent sudden synchronization of BCD CLOCK with CL3; this would result in a BCD CLOCK pulse occurring at the same time as pulse K of CL3 in FIG. 7. Instead, the next BCD CLOCK pulse after the 0000 pulse (i.e. the 0001 pulse) is delayed one and one-half clock periods from the 0000 pulse, rather than only one-half of a clock period. It will be understood that this is necessary, since the essence of the operation is to modify the clocking of counter 20, which is clocked by BCD CLOCK, in such a way that the particular half of the clock period during which the COMP pulse (the comparator output pulse) is recognized. This can only be achieved by clocking counter 20 in synchronization with CL1 if the comparator pulse occurs during the first half of the clock period and clocking counter 20 in synchronization with CL3 at a delayed point in time if the comparator pulse COMP occurs during the second half of the clock period. Clearly, if counter 20 were clocked at the time of occurrance of pulse K of CL3, that clocking would occur earlier than it would have occurred if DELAY had remained high, and the above-mentioned uncertainty associated with the counting of the durations of the integrations in analog-to-digital converter of FIG. 1 would be increased, rather than decreased as desired. The action of flip-flops 131 and 132 is such that if DELAY is high, then when the "CY5 or CY6" signal goes high at edge L in FIG. 7, then $Q_A$, which is the Q output of flip-flop 131, goes high, since it is clocked by a rising edge of pluse K of CL3. Flip-flop 132 is clocked by the rising edge of pulse N of CL1. This causes QB, the output of flip-flop 132, to rise at edge T in FIG. 7. Since QB on conductor 142 is gated into NAND gate 146 by CL3, nothing happens at the output of NAND gate 146 or, consequently, at the output of NOR gate 149 until the next CL3 pulse, i.e., pulse Q in FIG. 7. The coincidence of $Q_B$ and pulse Q of CL3 causes the 0001 pulse of BCD clock to occur. Similarly, the earlier coincidence of pulse N of CL1 and of $Q_A$ causes pulse R of STROBE CLOCK to appear, so that then STROBE CLOCK is synchronized with CL1 and BCD CLOCK is synchronized with CL3. This condition continues until DELAY is raised to a "one" at the beginning of cycle 2, as indicated in FIG. 9.

The above-described structure provides significant advantages over the known art. The resolution of the measurement of the comparator offset error in cycle 2 has been increased by a factor of at least two by storing the clock pulse of the comparator crossing during cycle 2, and effectively subtracting the stored representative of the comparator offset during cycle 5 to the same resolution. This reduces the uncertainty associated with the correction of the comparator offset error. This, in turn, provides an increased range of analog input voltages for which a digital output reading of "zero" will be obtained, as well as increased accuracy of the digital representation of the true voltage of the analog unknown input.

What is claimed is:

1. An analog-to-digital converter having a high resolution circuit comprising:

clock means for producing a first clock signal and a second clock signal delayed from said first clock signal;

comparator means having an input and having a threshold voltage for producing a comparison signal;

integrator means having an input and having an output coupled to said input of said comparator means, said integrator means being coupled for integrating a reference voltage;

first means responsive to said comparison signal and to said first and second clock signals for producing a third clock signal substantially in phase with said first clock signal if said comparison signal occurs between the beginning of a pulse of said first clock signal and the beginning of a subsequent pulse of said second clock signal and temporarily delayed to be substantially in phase with said second clock signal if said comparison signal occurs after said subsequent pulse;

storage means for storing a digital number;

counter means responsive to said third clock signal for counting one count in response to each pulse of said third clock signal during said integration from said first voltage and for transferring its contents to said storage means and then resetting its count to an initial digital number in response to said comparison signal; and means for determining when the counter means reaches a count equal to the digital number stored in the storage means.

2. In an analog-to-digital converter, a high resolution circuit comprising:

clock means for producing a first clock signal and a second clock signal delayed from said first clock signal;

comparator means having an input and having a threshold voltage for producing a comparison signal;

integrator means having an input and having an output coupled to said input of said comparator means, said integrator means being coupled for integrating a reference voltage from a first voltage to said threshold voltage and for integrating said reference voltage from a second voltage to said threshold voltage;

first means responsive to said comparison signal and to said first and second clock signals for producing a third clock signal, said third clock signal being substantially in phase with one of said first and second clock signals if said comparison signal occurs between the beginning of a pulse of said one of said first and said second clock signals and the beginning of a subsequent pulse of the other of said first and second clock signals and being temporarily delayed to be substantially in phase with the other of said first and second clock signals if said comparison signal occurs after said subsequent pulse;

storage means for storing a digital number;

counter means responsive to said third clock signal for counting one count in response to each pulse of said third clock signal during said integration from said first voltage and for transferring its contents to said storage means and then resetting its count to an initial digital number in response to said comparison signal; and coincidence means responsive to said counter means and to said storage means for producing a coincidence signal during said integration from said second voltage when said counter means has counted to a number equal to said transferred contents stored in said storage means, said coincidence signal effecting resetting said counter means to said initial digital number.

3. In an analog-to-digital converter, a high resolution circuit for producing a digital representation of an analog signal, said analog-to-digital conversion circuit comprising:

clock means for producing a first clock signal having a first period and a second clock signal having a second period equal in duration to the duration of said first period, said second clock signal being substantially out of phase with said first clock signal;

comparator means having an input and having a threshold voltage for producing a comparison signal representative of whether said input of said comparator means is at a voltage greater than or less than said threshold voltage;

integrator means having an input and having an output coupled to said input of said comparator means and including an amplifier having an offset voltage, said integrator means being coupled for integrating a reference voltage from said offset voltage to said threshold voltage of said comparator means during a first cycle of operation of said analog-to-digital conversion circuit and for integrating said reference voltage from a voltage representative of said analog signal to said threshold voltage of said comparator means during another cycle of operation of said analog-to-digital conversion circuit;

first means responsive to said comparison signal and to said first and second clock signals for producing a third clock signal, said third clock signal being substantially in phase with one of said first and second clock signals if said comparison signal occurs between the beginning of a pulse of said one of said first and said second clock signals and the beginning of a subsequent pulse of the other of said first and second clock signals, and said third clock signal being temporarily delayed to be substantially in phase with the other of said first and second clock signals if said comparison signal occurs after said subsequent pulse;

storage means for storing a digital number;

resettable counter means responsive to said third clock signal for counting one count in response to each pulse of said third clock signal during said integration during said first cycle of operation and for transferring its contents to said storage means and then resetting its count to an initial digital number in response to said comparison signal during said first cycle of operation; and coincidence means responsive to said counter means and to said storage means for producing a coincidence signal during said integration during said second cycle of operation when said counter means has counted to a number equal to said transferred contents stored in said storage means, said coincidence means being coupled for resetting said counter means to said initial digital number in response to said coincidence signal.

4. The analog-to-digital conversion circuit as recited in claim 3 further including second means coupling said first means to said comparator means for detecting whether said comparison signal occurs between the beginning of said pulse of said one of said first and second clock signals and the beginning of said subsequent pulse of the other of said and second clock signals and storing information representative of said detecting.

5. The analog-to-digital converter as recited in claim 3 wherein said clock source means includes a D-type flip-flop having a clock input and a D input and a Q output and a $\bar{Q}$ output, and further includes first and second NAND gates, said clock input being responsive to a master clock signal, said D input being coupled to said $\bar{Q}$ output and another input responsive to said master clock signal; the output of said first NAND gate producing said first clock signal, said second NAND gate having one input coupled to said Q output and the another input responsive to said master clock signal, the output of said second NAND gate producing said second clock signal.

6. The analog-to-digital converter as recited in claim 5 wherein said second means includes a D-type flip-flop having its D input responsive to said comparison signal and its clock input responsive to a plurality of control signals produced within said analog-to-digital converter.

7. The analog-to-digital converter as recited in claim 5 wherein said first means includes:
first and second D-type flip-flops;
the D input of said first D-type flip-flop being responsive to said detection means;
the D input of said second D-type flip-flop being responsive to the $\bar{Q}$ output of said first D-type flip-flop;
the clock input of said first D-type flip-flop being responsive to said first clock signal;
the clock input of said second D-type flip-flip being responsive to said second clock signal, said first means further including
first and second AND type gates and an OR type gate;
the output of said OR type gate producing said first clock signal, one input of said OR type gate being responsive to an output of said first AND type gate and another input of said OR type gate being responsive to an output of said second OR type gate;
one input of said first AND type gate being responsive to said first clock signal and another input of said first AND type gate being responsive to said $\bar{Q}$ output of said first D-type flip-flop;
one input of said second AND type gate being responsive to said second clock signal and another input of said second AND type gate being responsive to said Q output of said second D-type flip-flop.

* * * * *